(12) United States Patent
Yip

(10) Patent No.: US 8,547,750 B2
(45) Date of Patent: Oct. 1, 2013

(54) METHODS AND DEVICES FOR MEMORY READS WITH PRECHARGED DATA LINES

(75) Inventor: Aaron Yip, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 251 days.

(21) Appl. No.: 13/081,920

(22) Filed: Apr. 7, 2011

(65) Prior Publication Data

US 2012/0257450 A1    Oct. 11, 2012

(51) Int. Cl.
*G11C 11/34*    (2006.01)

(52) U.S. Cl.
USPC ...................................... 365/185.2

(58) Field of Classification Search
USPC ...................................... 365/185.2
See application file for complete search history.

(56) References Cited

U.S. PATENT DOCUMENTS

| | | | |
|---|---|---|---|
| 6,201,758 | B1 | 3/2001 | Morishima et al. |
| 6,438,064 | B2 | 8/2002 | Ooishi |
| 7,046,573 | B2 | 5/2006 | Takazawa et al. |
| 7,394,693 | B2 | 7/2008 | Aritome |
| 7,450,422 | B2 | 11/2008 | Roohparvar |
| 7,551,467 | B2 | 6/2009 | Roohparvar |
| 7,606,075 | B2 | 10/2009 | Aritome et al. |
| 7,652,926 | B2 * | 1/2010 | Kang et al. ............... 365/185.2 |
| 8,089,811 | B2 * | 1/2012 | Kang et al. ............... 365/185.17 |
| 8,194,461 | B2 * | 6/2012 | Kosaki et al. ............ 365/185.2 |
| 8,208,305 | B2 * | 6/2012 | Tanzawa ................... 365/185.17 |
| 2009/0231917 | A1 | 9/2009 | Chae et al. |

\* cited by examiner

*Primary Examiner* — Amir Zarabian
*Assistant Examiner* — Pablo Huerta
(74) *Attorney, Agent, or Firm* — Leffert Jay & Polglaze, P.A.

(57) ABSTRACT

Methods and devices for memory reads involving precharging adjacent data lines to a particular voltage for a read operation. During the operation, a data line associated with a selected memory cell is selectively discharged from the particular voltage depending upon the data value of the selected memory cell while the adjacent data line is maintained at the particular voltage. Various embodiments include the array architecture to facilitate precharging the adjacent pair of data lines to a particular voltage and maintaining the unselected data line at the particular voltage during a sensing phase of a read operation.

23 Claims, 8 Drawing Sheets

US 8,547,750 B2

METHODS AND DEVICES FOR MEMORY READS WITH PRECHARGED DATA LINES

TECHNICAL FIELD

The present disclosure relates generally to memory and, in particular, in one or more embodiments, the present disclosure relates to methods and devices for memory reads with precharged data lines.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is sometimes referred to as writing) of charge storage structures (e.g., floating gates or charge traps) or other physical phenomena (e.g., phase change or polarization), determine the data value of each cell. Common uses for flash memory include personal computers, personal digital assistants (PDAs), digital cameras, digital media players, cellular telephones, solid state drives and removable memory modules, and the uses are growing.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select lines, a source select line and a drain select line. A "column" refers to a group of memory cells that are commonly coupled to a local data line, such as a local bit line. It does not require any particular orientation or linear relationship, but instead refers to the logical relationship between memory cell and data line. The source select line includes a source select gate at each intersection between a NAND string and the source select line, and the drain select line includes a drain select gate at each intersection between a NAND string and the drain select line. Each source select gate is connected to a source line, while each drain select gate is connected to a data line, such as column bit line.

Reading the data value of a selected memory cell in an NAND flash memory device often involves precharging a bit line associated with the selected memory cell, followed by coupling the selected memory cell to the bit line and selectively discharging the bit line depending upon the data value of the selected memory cell, i.e., if a read voltage applied to the control gate of the selected memory cell activates the selected memory cell, the bit line is discharged, and if the read voltage fails to activate the selected memory cell, the bit line is maintained at the precharge voltage. This precharging of the bit line can take an extended period of time, e.g., about 10 µs at a 21 nm node, due to the large RC time constant of the bit lines.

For the reasons stated above, and for other reasons stated below which will become apparent to those skilled in the art upon reading and understanding the present specification, there is a need in the art for alternative memory architectures and methods of their operation.

DETAILED DESCRIPTION

Figure 1:
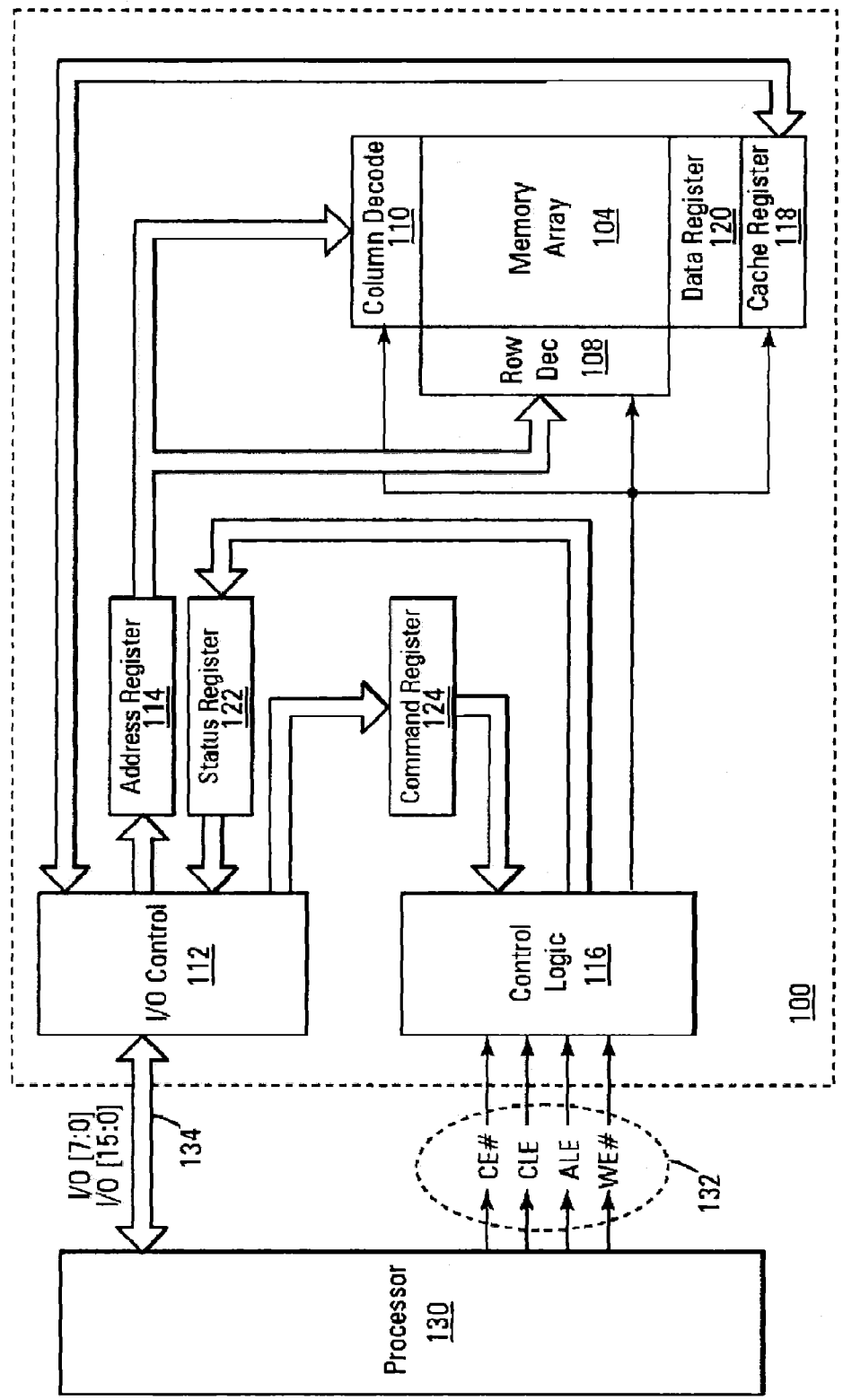
FIG. 1 is a simplified block diagram of an electronic system having at least one memory device in accordance with an embodiment of the invention.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

Various embodiments involve precharging adjacent data lines (e.g., bit lines) during a read operation. A data line associated with a selected memory cell is selectively discharged from the precharge voltage depending upon the data value of the selected memory cell while the adjacent data line is maintained at the precharge voltage. Various embodiments include the array architecture to facilitate maintaining the unselected data line at the precharge voltage.

FIG. 1 is a simplified block diagram of a memory device 100, as one example of an integrated circuit device, in communication with (e.g., coupled to) a processor 130 as part of an electronic system, according to an embodiment of the disclosure. Some examples of electronic systems include personal computers, personal digital assistants (PDAs), digital cameras, digital media players, digital recorders, games, appliances, vehicles, wireless devices, cellular telephones and the like. The processor 130 may be, for example, a memory controller or other external processor for use in the control and access of the memory device 100.

Memory device 100 includes an array of memory cells 104 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column. At least a portion of the array of memory cells 104 has an architecture in accordance with an embodiment of the disclosure.

A row decode circuitry 108 and a column decode circuitry 110 are provided to decode address signals. Address signals are received and decoded to access memory array 104. Memory device 100 also includes input/output (I/O) control circuitry 112 to manage input of commands, addresses and data to the memory device 100 as well as output of data and status information from the memory device 100. An address register 114 is coupled between I/O control circuitry 112 and row decode circuitry 108 and column decode circuitry 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decode circuitry 108 and column decode circuitry 110 to control the row decode circuitry 108 and column decode circuitry 110 in response to the addresses.

Control logic 116 is also coupled to a cache register 118. Cache register 118 latches data, either incoming or outgoing, as directed by control logic 116, to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is coupled between I/O control circuitry 112 and control logic 116 to latch the status information for output to the processor 130.

Memory device 100 receives control signals at control logic 116 from processor 130 over a control link 132. The control signals may include a chip enable CE#, a command latch enable CLE, an address latch enable ALE, and a write enable WE#. Memory device 100 receives command signals (which represent commands), address signals (which represent addresses), and data signals (which represent data) from processor 130 over a multiplexed input/output (I/O) bus 134 and outputs data to processor 130 over I/O bus 134.

Specifically, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
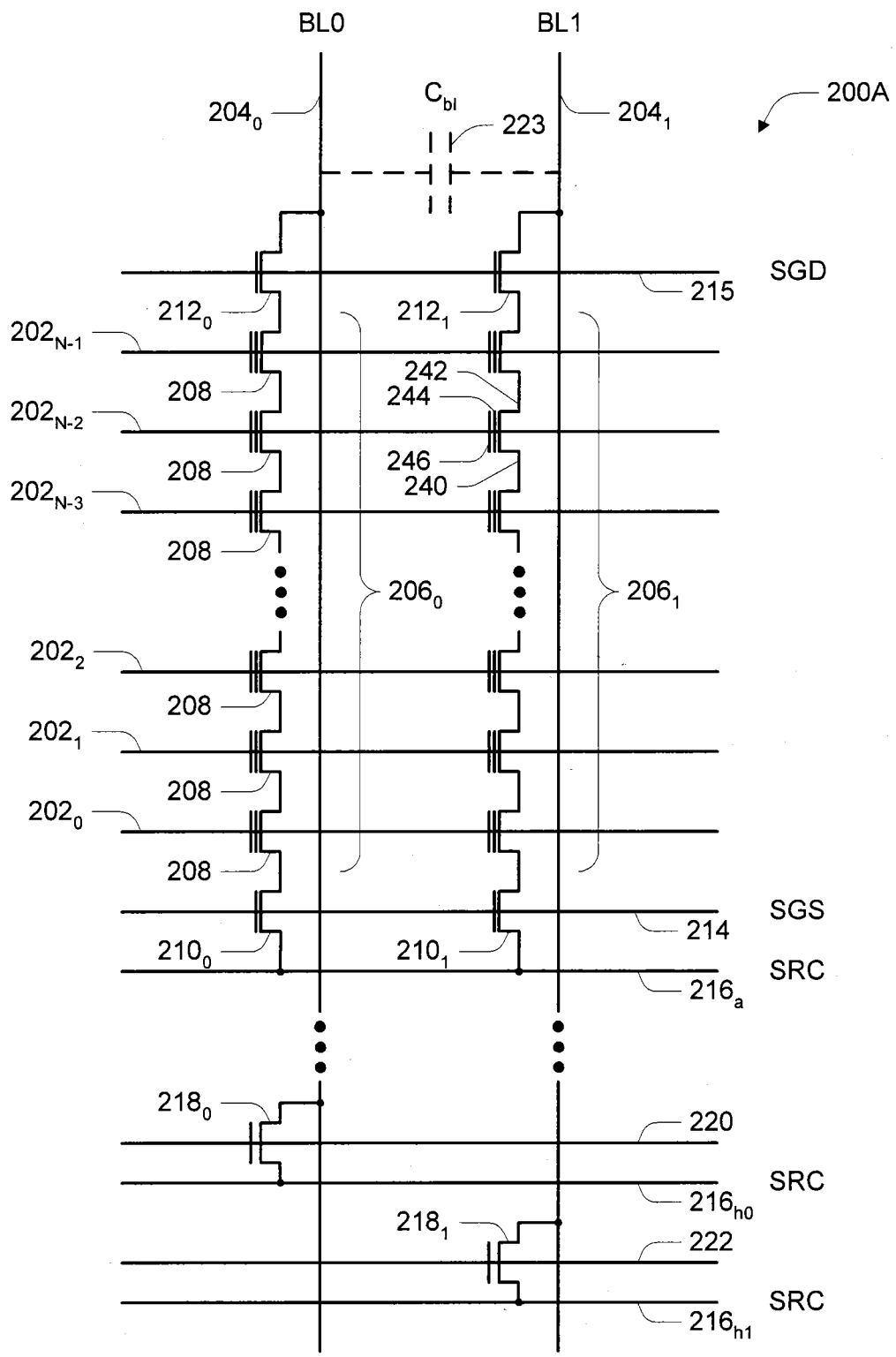
FIG. 2A is a schematic of a portion of a memory array of the prior art as could be used in a memory device of the type described with reference to FIG. 1.

FIG. 2A is a schematic of a memory array 200A, e.g., a NAND memory array as could be used as a portion of memory array 104. Memory array 200A may be formed in a common conductively doped region (e.g., a common p-well) formed in a semiconductor.

As shown in FIG. 2A, the memory array 200A includes access lines, commonly referred to as word lines (which may comprise commonly coupled control gates $202_0$ to $202_{N-1}$) and intersecting data lines, such as bit lines $204_0$ and $204_1$. For ease of addressing in the digital environment, the number of word lines 202 and the number of bit lines 204 are generally each some power of two.

Memory array 200A includes strings of memory cells, e.g., NAND strings, $206_0$ and $206_1$. Each string of memory cells 206 includes transistors 208, each located at an intersection of a word line 202 and a bit line 204. The transistors 208, depicted as floating-gate transistors in FIG. 2A, represent non-volatile memory cells to store user data. The floating-gate transistors 208 of each string of memory cells 206 are connected in series, source to drain, between one or more source select gates 210, e.g., a field-effect transistor (FET), and one or more drain select gates 212, e.g., an FET. Each source select gate 210 is located at an intersection of a bit line 204 and a source select line (SGS) 214, while each drain select gate 212 is located at an intersection of a bit line 204 and a drain select line (SGD) 215.

A source of each source select gate 210 is connected to a common supply node, e.g., array source line (SRC) $216_a$. The drain of each source select gate 210 is connected to the source of the first floating-gate transistor 208 of the corresponding string of memory cells 206. For example, the drain of source select gate $210_1$ is connected to the source of floating-gate transistor 208 of the corresponding string of memory cells $206_1$ coupled to word line $202_0$. A control gate of each source select gate 210 is connected to source select line 214. If multiple source select gates 210 are utilized for a given string of memory cells 206, they could be coupled in series between the common source line $216_a$ and the first floating-gate transistor 208 of that string of memory cells 206.

The drain of each drain select gate 212 is connected to a bit line 204 for the corresponding NAND string at a drain contact. For example, the drain of drain select gate $212_1$ is connected to the bit line $204_1$ for the corresponding string of memory cells $206_1$ at a drain contact. The source of each drain select gate 212 is connected to the drain of the last floating-gate transistor 208 of the corresponding string of memory cells 206. For example, the source of drain select gate $212_1$ is connected to the drain of floating-gate transistor 208 of the corresponding string of memory cells $206_1$ coupled to word line $202_{N-1}$. If multiple drain select gates 212 are utilized for a given string of memory cells 206, they could be coupled in series between the corresponding bit line 204 and the last floating-gate transistor 208 of that string of memory cells 206.

Typical construction of floating-gate transistors 208 includes a source 240 and a drain 242, a floating gate 244 as a charge storage structure, and a control gate 246, as shown in FIG. 2A. Floating-gate transistors 208 have their control gates 246 coupled to a word line 202 (e.g., the control gates may be commonly coupled to form a word line). A column of the floating-gate transistors 208 is typically one or more strings of memory cells 206 selectively coupled to a given bit line 204. A row of the floating-gate transistors 208 is typically two or more floating-gate transistors 208 commonly coupled to a given word line 202, and is often every other floating-gate transistor 208 (e.g., even or odd memory cells) commonly coupled to a given word line 202.

In reading a selected memory cell of the memory array 200A, i.e., a particular floating-gate transistor 208 of a string of memory cells 206, sensing devices (not shown in FIG. 2A) may look for a voltage drop on a bit line 204 coupled to the selected memory cell. For example, the selected bit line 204 may be precharged to a precharge voltage (Vpchg), such as 1.0V. When a read voltage (Vread) is applied to the word line 202 coupled to the selected memory cell and pass voltages (Vpass) are applied to remaining word lines 202 of the same string of memory cells 206, the bit line 204 will lose charge, and thus voltage, if the selected memory cell is activated, but the bit line 204 will tend to maintain its charge if the selected memory cell remains deactivated. The data value of the selected memory cell is sensed some time after applying the read voltage, such as by looking at the voltage of the bit line 204. The selected memory cell may be deemed to have a first data value if the bit line falls below some predetermined voltage, e.g., 0.2V, but a second data value if the bit line voltage is higher than the predetermined voltage.

Precharging of the bit lines 204 is often performed by coupling a selected bit line 204 to a supply node, which may be referred to as a helper source. For example, in the memory array 200A, helper gate $218_0$ may be used to couple bit line $204_0$ to helper source (SRC) $216_{h0}$ in response to control signal 220, while helper gate $218_1$ may be used to couple bit line $204_1$ to helper source (SRC) $216_{h1}$ in response to control signal 222. It is noted that the array source $216_a$, helper source $216_{h0}$ and helper source $216_{h1}$ are commonly coupled as a single supply node SRC in the memory array 200A. In operation, if the selected memory cell is coupled to bit line $204_0$, e.g., if a floating-gate transistor 208 of the string of memory cells $206_0$ were selected for reading, bit line $204_0$ would be precharged to the precharge voltage by driving the helper source $216_{h0}$ to the precharge voltage and by driving the control signal 220 to an appropriate voltage to cause the activation of helper gate $218_0$. With the adjacent bit line $204_1$ isolated from its helper source $216_{h1}$ during this time, a parasitic capacitive coupling (Cbl) 223 can have a significant impact on the precharging of the selected bit line $204_0$.

Although the architecture of FIG. 2A is described with specific reference to floating-gate memory cells, other non-volatile memory cells using threshold voltages to define data values are also suitable for such architectures, such as phase-change memory cells, ferroelectric memory cells, charge trap memory cells, etc.

Figure 2B:
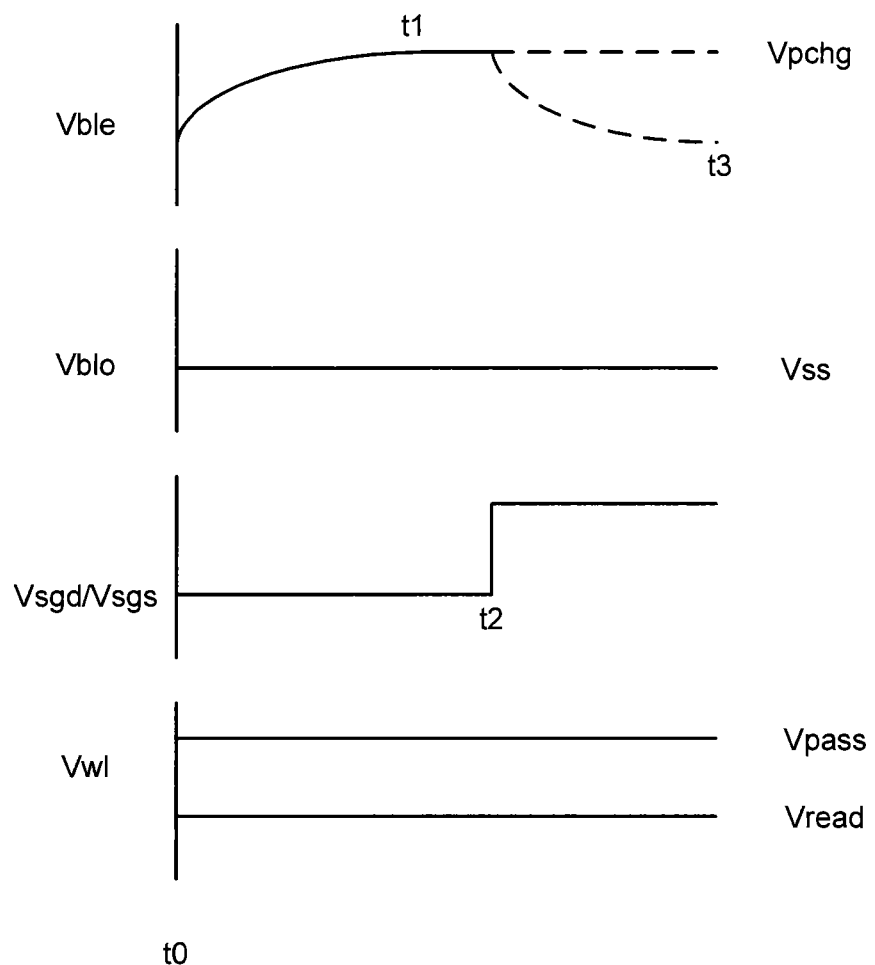
FIG. 2B depicts signal traces during an example read operation of the memory array of FIG. 2A.

FIG. 2B depicts signal traces during an example read operation of the memory array of FIG. 2A. The example read operation presumes that the memory cell selected for reading, i.e., the selected memory cell, is a floating-gate transistor 208 of the string of memory cells $206_0$, such that the bit line $204_0$ is the bit line to be precharged. In the depicted example, at time t0, the helper gate $218_0$ is activated to couple the bit line $204_0$ to the helper source $216_{h0}$ driven to the precharge voltage. This results in the voltage of bit line $204_0$ (Vble) being driven to the precharge voltage (Vpchg). The voltage of the adjacent bit line $204_1$ (Vblo) is maintained at a reference potential (Vss), which is commonly ground. Word line voltages (Vwl) are applied to the word lines 202 of the string of memory cells $206_0$ sufficient to selectively activate the selected memory cell depending upon its data value and to operate the remaining memory cells of the string of memory cells $206_0$ as pass gates. For example, the read voltage (Vread) is applied to the word line 202 coupled to the selected memory cell and the pass voltage (Vpass) is applied to remaining word lines 202 coupled to other memory cells of the string of memory cells 206 containing the selected memory cell.

At time t1, the voltage of the bit line $204_0$ is at the precharge voltage. It is recognized that circuit losses may occur and that the bit line $204_0$ may not reach the same voltage as its helper source $216_{h0}$ before a steady-state condition occurs. At time t2, the select gates $210_0$ and $212_0$ are activated to couple the string of memory cells $206_0$ to the bit line $204_0$, such as by driving the voltage of the drain select line 215, e.g., Vsgd, and the voltage of the source select line 214, e.g., Vsgs, to values sufficient to activate their respective select gates.

Once the bit line $204_0$ is coupled to the string of memory cells $206_0$ at time t2, the voltage of the bit line $204_0$ will begin to decay, e.g., decrease if the bit line $204_0$ is at a greater potential than the array source $216_a$, if the selected memory cell is activated in response to the read voltage as charge from the bit line $204_0$ is shared with, e.g., lost to, the array source $216_a$. However, if the selected memory cell remains deactivated in response to the read voltage, the voltage of the bit line $204_0$ will tend to remain at the precharge voltage. It is recognized that leakage may occur even if the selected memory cell is deactivated, but such leakage is typically very small in comparison to the charge loss through an activated selected memory cell. At time t3, the bit line voltage is sensed to determine the data value of the selected memory cell.

Figure 3A:
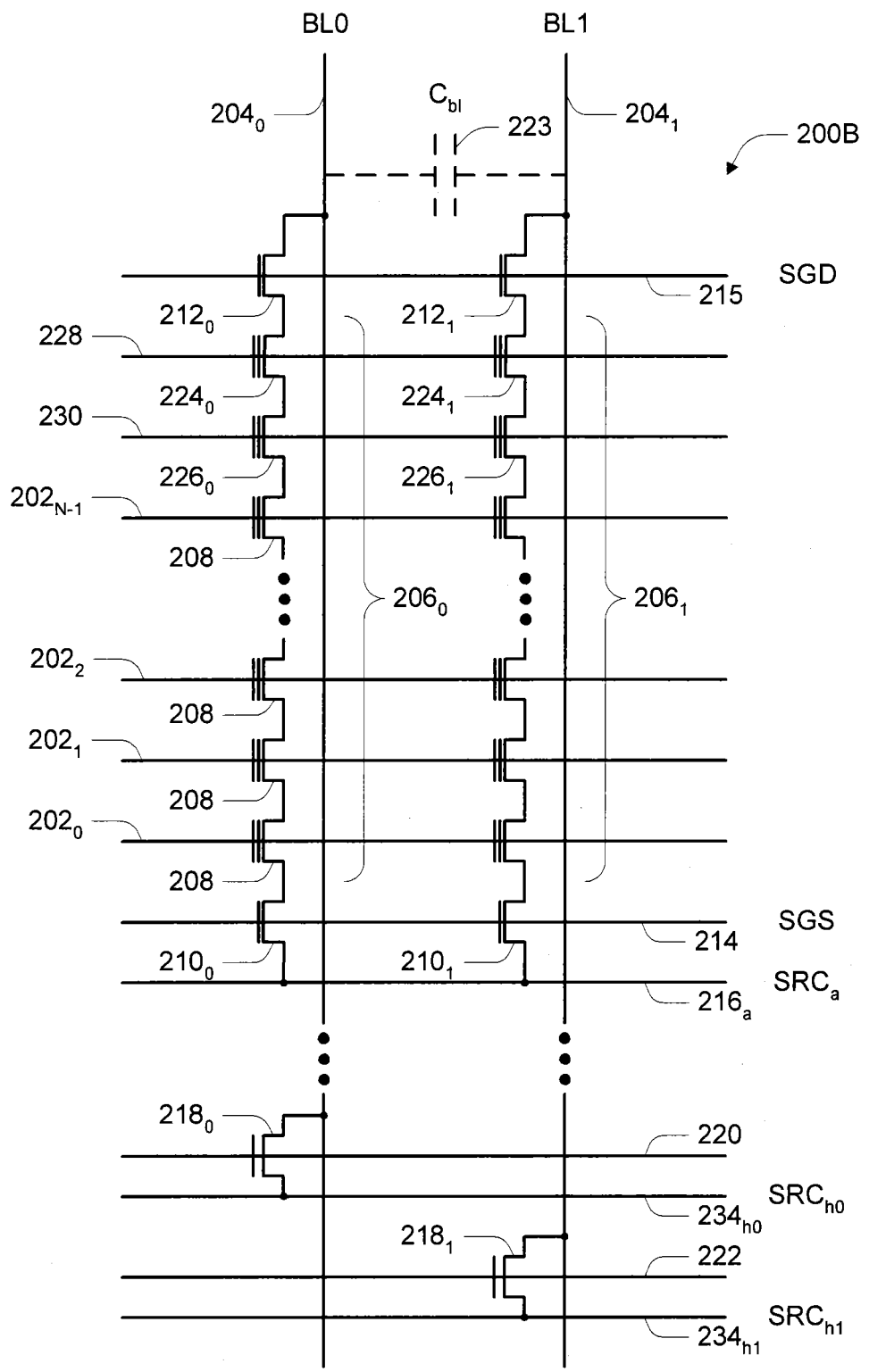
FIG. 3A is a schematic of a portion of a memory array in accordance with an embodiment of the disclosure as might be found in a memory device of the type described with reference to FIG. 1.

FIG. 3A is a schematic of a memory array 200B in accordance with an embodiment of the disclosure, e.g., a NAND memory array as could be used as a portion of memory array 104. Memory array 200B may be formed in a common conductively doped region (e.g., a common p-well) formed in a semiconductor. Some of the elements of the memory array 200B are similar to the memory array 200A. In particular, each depicts strings of memory cells 206, floating-gate transistors 208, access lines (e.g., word lines) 202, data lines (e.g., bit lines) 204, select gates 210 and 212, and helper gates 218. The discussion of these elements will not be repeated with respect to FIG. 3A, as like reference numerals describe substantially similar components. However, in addition to differences in their methods of operation, to be discussed later, the memory array 200B also differs structurally from the memory array 200A. In particular, the strings of memory cells 206 of memory array 200B further include additional memory cells, such as dummy memory cells 224 and 226. While the dummy memory cells 224/226 may have the same structure as the remaining memory cells of the strings of memory cells 206, they serve a different purpose. For example, the memory array 200B is structured such that data values of the dummy memory cells 224/226 are not output from the memory device during a read operation, i.e., dummy memory cells 224/226 are not used to store user data. A read operation will be considered to be an operation initiated by a user of a memory device, e.g., using a read command, in order to output data previously stored on the memory device, e.g., data stored in response to a write command, and does not include operations on the memory device performed fundamentally for the testing, repair or adjustment of the memory device. The memory array 200B further is configured to isolate at least one of its helper sources 234 from the array source $216_a$ during a read operation, such as while the selected bit line 204 is being selectively discharged to the array source $216_a$.

The helper sources $234_{h0}$ ($SRC_{h0}$) and $234_{h1}$ ($SRC_{h1}$) are isolated from the array source $216_a$ sufficiently to permit different voltages to be applied to the array source $216_a$ and at least one of the helper sources 234 during a sensing phase of a read operation of the memory array 200B. In reading a selected memory cell of the memory array 200B, i.e., a particular floating-gate transistor 208 of a string of memory cells 206, sensing devices (not shown in FIG. 3A) may look for a voltage drop on a bit line 204 coupled to the selected memory cell. For example, the selected bit line 204 may be precharged to a precharge voltage (Vpchg), such as 1.0V. When a read voltage (Vread) is applied to the word line 202 coupled to the selected memory cell and pass voltages (Vpass) are applied to remaining word lines 202 of the same string of memory cells 206, the bit line 204 will lose charge, and thus voltage, if the selected memory cell is activated, but the bit line 204 will tend to maintain its charge if the selected memory cell remains deactivated. The data value of the selected memory cell is sensed some time after applying the read voltage, such as by looking at the voltage of the bit line 204. The selected memory cell may be deemed to have a first data value if the bit line falls below some predetermined voltage, e.g., 0.2V, but a second data value if the bit line voltage is higher than the predetermined voltage.

Precharging of the bit lines 204 may be performed by coupling a selected bit line 204 to a supply node, which may be referred to as a helper source. For example, in the memory array 200B, helper gate $218_0$ may be used to couple bit line $204_0$ to helper source (SRC) $234_{h0}$ in response to control signal 220, while helper gate $218_1$ may be used to couple bit line $204_1$ to helper source (SRC) $234_{h1}$ in response to control signal 222. It is noted that helper source $234_{h0}$ and helper source $234_{h1}$ may be commonly coupled as a single supply node in certain configurations, but at least one helper source 234, i.e., the helper source 234 not associated with the selected bit line, is isolated from the array source $216_a$ during the read operation. In accordance with various embodiments, both the bit line 204 associated with the selected memory cell, e.g., bit line $204_0$, and the adjacent bit line 204, e.g., bit line $204_1$, are precharged to the precharge voltage by driving their respective helper sources $234_{h0}$ and $234_{h1}$ to the precharge voltage and by driving the control signals 220 and 222 to appropriate voltages to cause the activation of helper gates $218_0$ and $218_1$, respectively. By driving both bit lines 204 to the precharge voltage, the parasitic capacitive coupling 223 can be reduced, facilitating a lower RC time constant and thus a faster precharge time. It is expected that precharge times, for a 21 nm node, could be reduced to about 1-2 μs when adjacent bit lines are precharged to the same voltage as described herein, compared to about 10 μs where adjacent bit lines are held at a ground potential.

During a read operation, it is generally desired to maintain the unselected bit line 204, i.e., the bit line 204 not associated with the selected memory cell, at a constant voltage in order to reduce the effects of parasitic capacitive coupling to the selected bit line 204, i.e., the bit line 204 associated with the selected memory cell. However, because the strings of memory cells 206 share the same control signals, if the architecture of FIG. 2A were used, the unselected bit line 204 would be coupled to the array source $216_a$ if the read voltage activated the memory cell adjacent to the selected memory cell, and would thus lose charge undesirably. Various embodiments mitigate such charge loss of the unselected bit line 204 through the use of two or more dummy memory cells 224 and 226.

In general, the dummy memory cells 224 are programmed to have threshold voltages arranged such that a single control signal applied to dummy access line (e.g., dummy word line) 228 is capable of activating one dummy memory cell 224, e.g., dummy memory cell $224_0$, while deactivating the adjacent dummy memory cell 224, e.g., dummy memory cell $224_1$. This relationship could be repeated across more than two strings of memory cells 206, such as in an alternating pattern. For example, a single control signal applied to dummy word line 228 might activate all even dummy memory cells 224 while deactivating all odd dummy memory cells 224 for dummy memory cells 224 numbered sequentially along the length of the dummy word line 228. For example, even dummy memory cells 224 could have target threshold voltages of 0V while odd dummy memory cells 224 could have target threshold voltages of 5V. In this manner, a 3V control signal applied to dummy word line 228 would activate all even dummy memory cells 224 while deactivating all odd dummy memory cells 224. While only even dummy memory cell $224_0$ and odd dummy memory cell $224_1$ are depicted in the figures, it will be apparent that the structure depicted in FIG. 3A could be continued to the right in a repeating pattern. In addition, while certain dummy memory cells 224/226 may have the same target threshold voltage, it is recognized that programming any such memory cell to a target threshold voltage will generally lead to a distribution of threshold voltages around the target value, depending upon the algorithms used for the programming of any such memory cell. For example, it is well known that using small incremental changes in programming voltages will generally allow for tighter threshold voltage distributions compared with using large incremental changes in programming voltages, but will also generally lead to longer programming times. Thus, a compromise is typically made between having tighter threshold voltage distributions and having shorter programming times.

It is noted that the target threshold voltages of all even or odd dummy memory cells 224 need not be the same. For example, the even dummy memory cells 224 could have a variety of target threshold voltages, e.g., a variety of target threshold voltages between 0V and 2V, and the odd dummy memory cells 224 could have a variety of target threshold voltages, e.g., a variety of target threshold voltages between 4V and 6V, and a 3V control signal applied to dummy word line 228 would activate all even dummy memory cells 224 while deactivating all odd dummy memory cells 224. Other values of target threshold voltages may be used and it would be trivial to determine whether such other values would facilitate activating one dummy memory cell 224 while deactivating an adjacent dummy memory cell 224.

Similarly, the dummy memory cells 226 are programmed to have target threshold voltages arranged such that a single control signal applied to dummy access line (e.g., dummy word line) 230 is capable of activating one dummy memory cell 226, e.g., dummy memory cell $226_1$, while deactivating the adjacent dummy memory cell 226, e.g., dummy memory cell $226_0$. This relationship could be repeated across more than two strings of memory cells 206, such as in an alternating pattern. For example, a single control signal applied to dummy word line 230 might activate all odd dummy memory cells 226 while deactivating all even dummy memory cells 226 for dummy memory cells 226 numbered sequentially along the length of the dummy word line 230. For example, odd dummy memory cells 226 could have target threshold voltages of 0V while even dummy memory cells 226 could have target threshold voltages of 5V. In this manner, a 3V control signal applied to dummy word line 230 would activate all odd dummy memory cells 226 while deactivating all even dummy memory cells 226. While only even dummy memory cell $226_0$ and odd dummy memory cell $226_1$ are depicted in the figures, it will be apparent that the structure depicted in FIG. 3A could be continued to the right in a repeating pattern.

It is noted that the target threshold voltages of all even or odd dummy memory cells 226 need not be the same. For example, the even dummy memory cells 226 could have a variety of target threshold voltages, e.g., a variety of target threshold voltages between 4V and 6V, and the odd dummy memory cells 226 could have a variety of target threshold voltages, e.g., a variety of target threshold voltages between 0V and 2V, and a 3V control signal applied to dummy word line 230 would activate all odd dummy memory cells 226 while deactivating all even dummy memory cells 226. Other values of target threshold voltages may be used and it would be trivial to determine whether such other values would permit activating one dummy memory cell 226 while deactivating an adjacent dummy memory cell 226.

To facilitate current flow through the dummy memory cells 224/226 of the string of memory cells 206 containing the selected memory cell while mitigating current flow through the dummy memory cells 224/226 of the adjacent string of memory cells 206, the pattern of target threshold voltages of the dummy memory cells 224 are different than, e.g., opposite of, the pattern of target threshold voltages of the dummy memory cells 226. For example, if the pattern of target threshold voltages of the dummy memory cells 224 permit a single control signal to activate dummy memory cell $224_0$ and deactivate its adjacent dummy memory cell $224_1$, the pattern of target threshold voltages of the dummy memory cells 226 would permit a single control signal to deactivate dummy memory cell $226_0$ and activate its adjacent dummy memory cell $226_1$. In this manner, a control signal can be applied to dummy word line 228 sufficient to activate dummy memory cell $224_0$ and deactivate its adjacent dummy memory cell $224_1$, e.g., a control signal having a potential greater than the threshold voltage of dummy memory cell $224_0$ and less than the threshold voltage of dummy memory cell $224_1$, while a control signal can be applied to dummy word line 230 sufficient to activate both dummy memory cell $226_0$ and its adjacent dummy memory cell $226_1$, e.g., a control signal having a potential greater than the threshold voltages of both dummy memory cell $226_0$ and dummy memory cell $226_1$, to permit current flow through the string of memory cells $206_0$ dependent only on the data value of the selected memory cell, while mitigating current flow through the string of memory cells $206_1$ regardless of the data value of its memory cell sharing the same word line 202 as the selected memory cell.

As with the memory array 200A, although the architecture of memory array 200B is described with specific reference to floating-gate memory cells, other non-volatile memory cells using threshold voltages to define data values are also suitable for such architectures, such as phase-change memory cells, ferroelectric memory cells, charge trap memory cells, etc. Furthermore, while the dummy memory cells 224 and 226 are depicted to be located only at the end of the string of memory cells 206 nearest their associated bit line 204, these dummy memory cells 224 and 226 could be located anywhere in the string of memory cells 206, and even separated from each other, e.g., dummy memory cell 224 at one end of the string of memory cells 206 and dummy memory cell 226 at the other end of the string of memory cells 206, as their function of facilitating current flow in one string of memory cells 206 and mitigating current flow in an adjacent string of memory cells 206 can be accomplished regardless of their relative location within those strings of memory cells 206. In addition, because the dummy memory cells 224 can act in concert to facilitate current flow in one string of memory cells 206 and mitigate current flow in an adjacent string of memory cells 206, one or both of the select gates 210 and 212 could be eliminated from the architecture depicted in FIG. 3A.

Figure 3B:
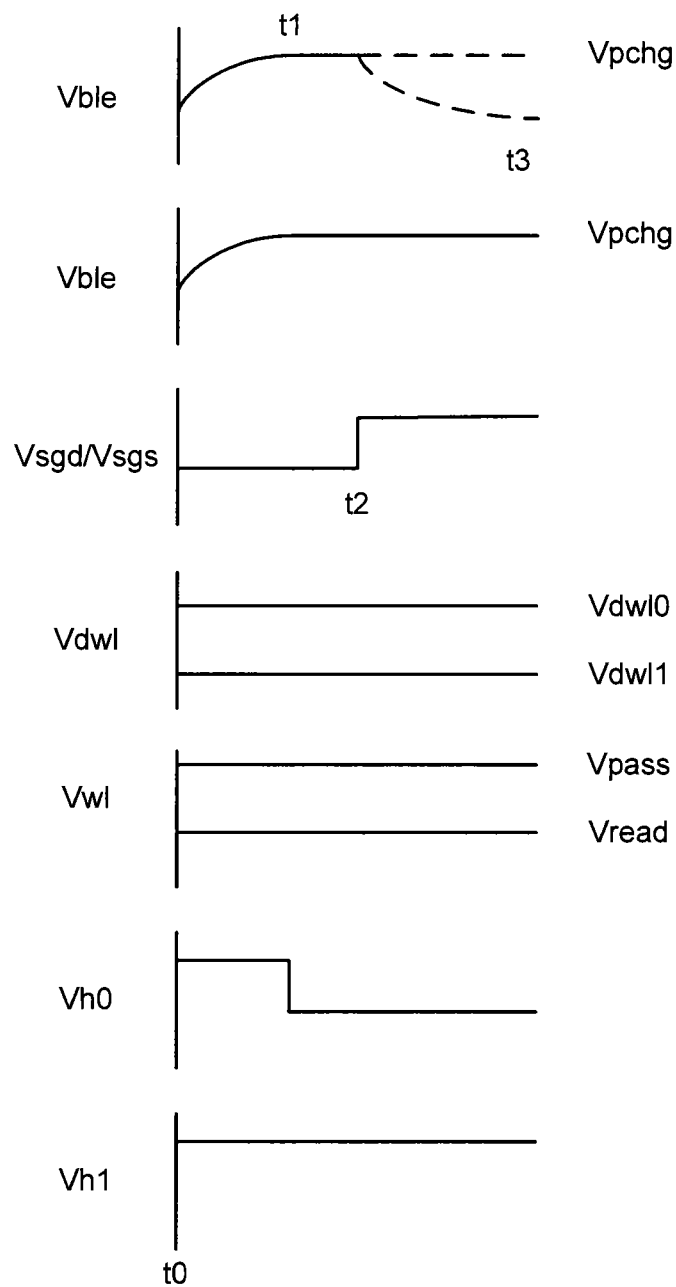
FIGS. 3B-3C depict signal traces during example read operations of the memory array of FIG. 3A.

FIG. 3B depicts signal traces during an example read operation of the memory array 200B of FIG. 3A. The example read operation of FIG. 3B presumes that the memory cell selected for reading, i.e., the selected memory cell, is a floating-gate transistor 208 of the string of memory cells $206_0$. In the depicted example, at time t0, the helper gates $218_0$ and $218_1$ are activated, such as by applying control signals Vh0 and Vh1 sufficient to activate the helper gates $218_0$ and $218_1$, respectively, to couple the bit line $204_0$ to the helper source $234_{h,0}$ and the bit line $204_1$ to the helper source $234_{h,1}$, both driven to the precharge voltage. This results in the voltages of bit line $204_0$ (Vble) and bit line $204_1$ (Vblo) being driven to the precharge voltage (Vpchg). Word line voltages (Vwl) are applied to the word lines 202 sufficient to selectively activate the selected memory cell depending upon its data value and to operate the remaining memory cells of the string of memory cells $206_0$, other than the dummy memory cells 224/226, as pass gates. For example, the read voltage (Vread) is applied to the word line 202 coupled to the selected memory cell and the pass voltage (Vpass) is applied to remaining word lines 202 coupled to other memory cells of the string of memory cells containing the selected memory cell. Control signals, e.g., dummy word line voltages (Vdwl), are applied to the dummy word lines 228/230 sufficient to activate both of the dummy memory cells 224/226 of the string of memory cells $206_0$, and to activate less than all, e.g., only one, of the dummy memory cells 224/226 of the string of memory cells $206_1$. For example, a first dummy word line voltage (Vdwl0) having a potential greater than the threshold voltage of dummy memory cell $224_0$ and less than the threshold voltage of dummy memory cell $224_1$ might be applied to the dummy word line 228, while a second dummy word line voltage (Vdwl1) having a potential greater than the threshold voltages of dummy memory cell $226_0$ and greater than the threshold voltage of dummy memory cell $226_1$ might be applied to the dummy word line 230.

At time t1, the voltage of the bit lines $204_0$ and $204_1$ are at a particular voltage, e.g., the precharge voltage. It is recognized that circuit losses may occur and that the bit lines $204_0$ and $204_1$ may not reach the same voltage as their respective helper sources $234_{h,0}$ and $234_{h,1}$ before a steady-state condition occurs. It is further recognized that other variations of operating characteristics of integrated circuits are commonly encountered, such that a node will be deemed to be at a particular voltage if a difference is within expected variations, whether the actual voltage of the node is above or below the particular voltage. The bit line $204_0$ is then isolated from its helper source $234_{h,0}$, such as by applying the control signal Vh0 sufficient to deactivate the helper gate $218_0$. However, the bit line $204_1$ remains coupled to its helper source $234_{h,1}$ in order to maintain its voltage at the precharge voltage.

At time t2, the select gates $210_0$ and $212_0$ are activated to couple the string of memory cells $206_0$ to the bit line $204_0$, such as by driving the voltage of the drain select line 215, e.g., Vsgd, and the voltage of the source select line 214, e.g., Vsgs, to values sufficient to activate their respective select gates.

Once the bit line $204_0$ is coupled to the string of memory cells $206_0$ at time t2, the voltage of the bit line $204_0$ will begin to decay, e.g., decrease if the bit line $204_0$ is at a greater potential than the array source $216_a$, if the selected memory cell is activated in response to the read voltage as charge from the bit line $204_0$ is shared with, e.g., lost to, the array source $216_a$. However, if the selected memory cell remains deactivated in response to the read voltage, the voltage of the bit line $204_0$ will tend to remain at the precharge voltage. It is recognized that leakage may occur even if the selected memory cell is deactivated, but such leakage is typically very small in comparison to the charge loss through an activated selected memory cell. At time t3, the bit line voltage is sensed to determine the data value of the selected memory cell. The period between time t2, when selective discharging begins, and time t3, when sensing occurs, will be referred to as the sensing phase of the read operation.

Also at time t2, the select gates $210_1$ and $212_1$ are activated to couple the string of memory cells $206_1$ to the bit line $204_1$ in response to the control signals Vsgd and Vsgs. However, because at least one of the dummy memory cells $224_1$ or $226_1$ is deactivated, current flow through the string of memory cells $206_1$ is mitigated regardless of whether the memory cell receiving the read voltage is deactivated. As such, the bit line $204_1$ will tend to remain at the precharge voltage.

Figure 3C:
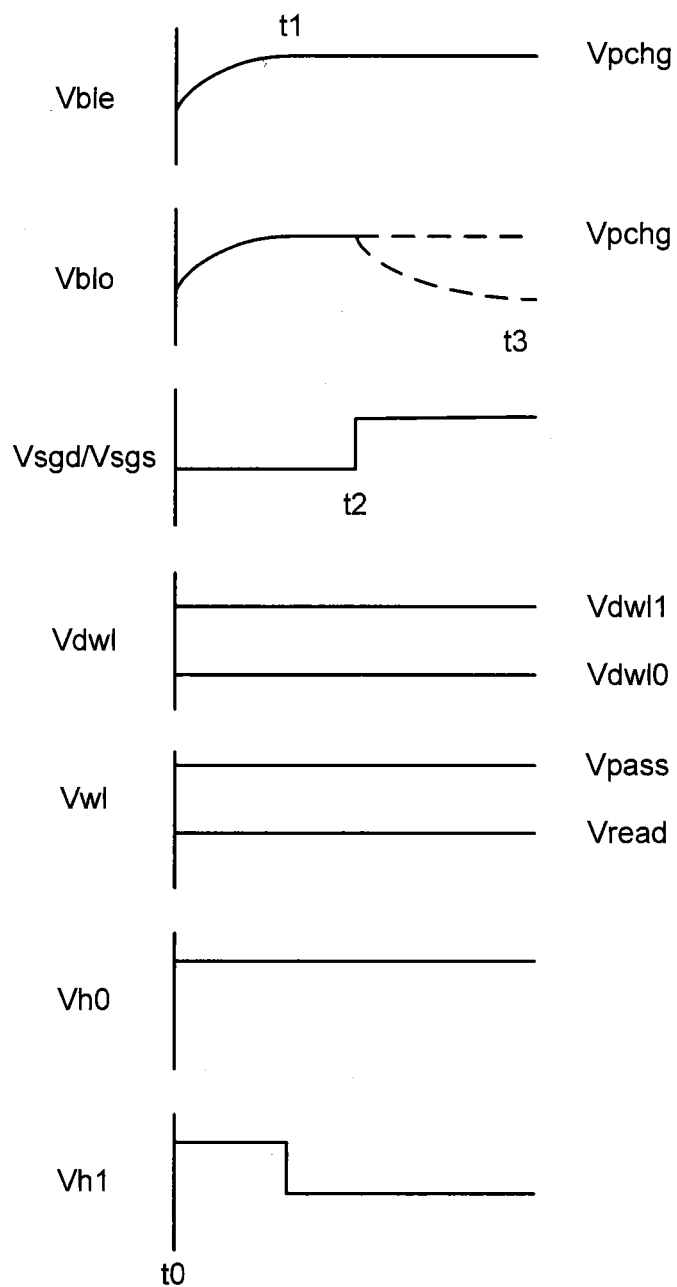

FIG. 3C depicts signal traces during another example read operation of the memory array 200B of FIG. 3A. The example read operation of FIG. 3C presumes that the memory cell selected for reading, i.e., the selected memory cell, is a floating-gate transistor 208 of the string of memory cells $206_1$. In the depicted example, at time t0, the helper gates $218_0$ and $218_1$ are activated, such as by applying control signals Vh0 and Vh1 sufficient to activate the helper gates $218_0$ and $218_1$, respectively, to couple the bit line $204_0$ to the helper source $234_{h0}$ and the bit line $204_1$ to the helper source $234_{h1}$, both driven to the precharge voltage. This results in the voltages of bit line $204_0$ (Vble) and bit line $204_1$ (Vblo) being driven to the precharge voltage (Vpchg). Word line voltages (Vwl) are applied to the word lines 202 sufficient to selectively activate the selected memory cell depending upon its data value and to operate the remaining memory cells of the string of memory cells $206_1$, other than the dummy memory cells 224/226, as pass gates. For example, the read voltage (Vread) is applied to the word line 202 coupled to the selected memory cell and the pass voltage (Vpass) is applied to remaining word lines 202 coupled to other memory cells of the string of memory cells containing the selected memory cell. Control signals, e.g., dummy word line voltages (Vdwl), are applied to the dummy word lines 228/230 sufficient to activate both of the dummy memory cells 224/226 of the string of memory cells $206_1$, and to activate less than all, e.g., only one, of the dummy memory cells 224/226 of the string of memory cells $206_0$. For example, a first dummy word line voltage (Vdwl0) having a potential greater than the threshold voltages of dummy memory cell $224_0$ and greater than the threshold voltage of dummy memory cell $224_1$ might be applied to the dummy word line 228, while a second dummy word line voltage (Vdwl1) having a potential less than the threshold voltage of dummy memory cell $226_0$ and greater than the threshold voltage of dummy memory cell $226_1$ might be applied to the dummy word line 230.

At time t1, the voltage of the bit lines $204_0$ and $204_1$ are at the precharge voltage. The bit line $204_1$ is then isolated from its helper source $234_{h1}$, such as by applying the control signal Vh1 sufficient to deactivate the helper gate $218_1$. However, the bit line $204_0$ remains coupled to its helper source $234_{h0}$ in order to maintain its voltage at the precharge voltage.

At time t2, the select gates $210_1$ and $212_1$ are activated to couple the string of memory cells $206_1$ to the bit line $204_1$, such as by driving the voltage of the drain select line 215, e.g., Vsgd, and the voltage of the source select line 214, e.g., Vsgs, to values sufficient to activate their respective select gates.

Once the bit line $204_1$ is coupled to the string of memory cells $206_1$ at time t2, the voltage of the bit line $204_1$ will begin to decay, e.g., decrease if the bit line $204_1$ is at a greater potential than the array source $216_a$, if the selected memory cell is activated in response to the read voltage as charge from the bit line $204_1$ is shared with, e.g., lost to, the array source $216_a$. However, if the selected memory cell remains deactivated in response to the read voltage, the voltage of the bit line $204_1$ will tend to remain at the precharge voltage. It is recognized that leakage may occur even if the selected memory cell is deactivated, but such leakage is typically very small in comparison to the charge loss through an activated selected memory cell. At time t3, the bit line voltage is sensed to determine the data value of the selected memory cell.

Also at time t2, the select gates $210_0$ and $212_0$ are activated to couple the string of memory cells $206_0$ to the bit line $204_0$ in response to the control signals Vsgd and Vsgs. However, because at least one of the dummy memory cells $224_0$ or $226_0$ is deactivated, current flow through the string of memory cells $206_0$ is mitigated regardless of whether the memory cell receiving the read voltage is deactivated. As such, the bit line $204_0$ will tend to remain at the precharge voltage.

Although the foregoing examples show only two dummy memory cells, additional dummy memory cells could be used. For example, to provide added mitigation of current flow through the unselected bit line, an extra set of dummy memory cells could be added to each string of memory cells. In this example, it will be apparent that all four dummy memory cells could be activated in one string of memory cells, while activating less than all, e.g., two, dummy memory cells in an adjacent string of memory cells. While odd numbers of dummy memory cells could also be used, such would result in different numbers of deactivated dummy memory cells depending upon which string of memory cells contains the selected memory cell.

Figure 4:
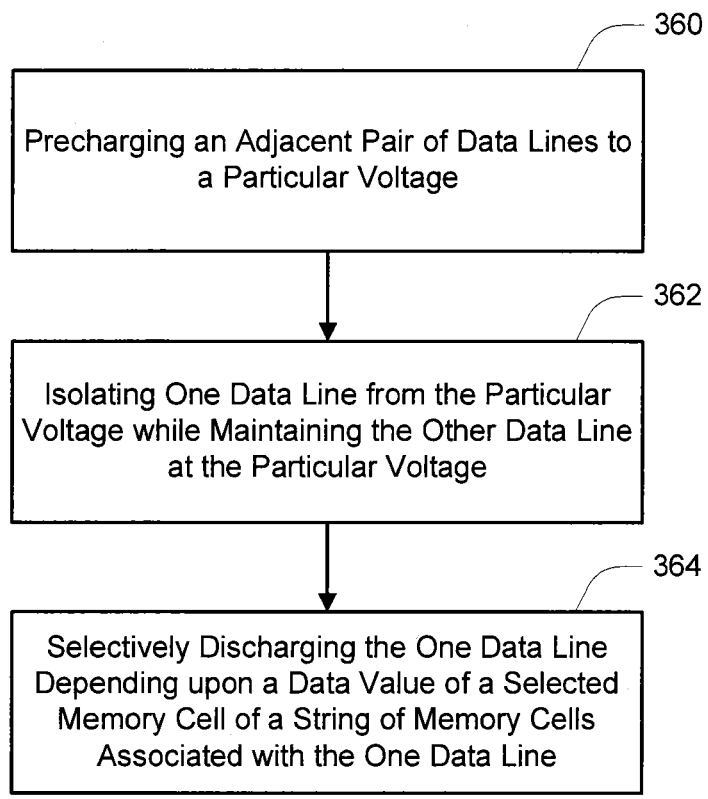
FIG. 4 is a flowchart of a method of operating a memory device in accordance with an embodiment of the disclosure.

FIG. 4 is a flowchart of a method of operating a memory device in accordance with an embodiment of the disclosure. At 360, an adjacent pair of data lines is precharged to a particular voltage, e.g., a precharge voltage. At 362, one of the data lines is isolated from the particular voltage while the other data line is maintained at the particular voltage. At 364, the data line isolated from the particular voltage is selectively discharged depending upon a data value of a memory cell of a string of memory cells associated with that data line that is selected for reading. As used herein, discharging will refer to the intentional sharing of charge between a data line and a supply node, e.g., an array source, regardless of the direction of current flow.

Figure 5:
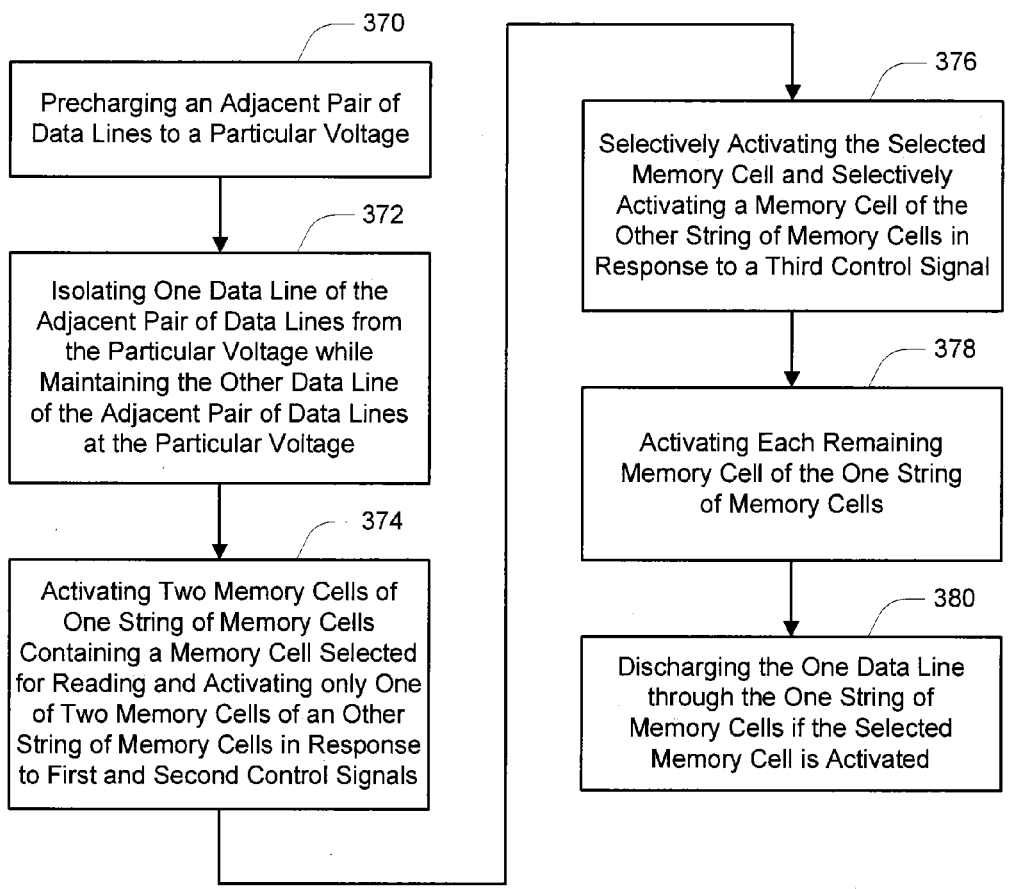
FIG. 5 is a flowchart of a method of operating a memory device in accordance with another embodiment of the disclosure.

FIG. 5 is a flowchart of a method of operating a memory device in accordance with another embodiment of the disclosure. At 370, an adjacent pair of data lines is precharged to a particular voltage, e.g., a precharge voltage. At 372, one of the data lines of the adjacent pair of data lines is isolated from the particular voltage while the other data line of the adjacent pair of data lines is maintained at the particular voltage. At 374, two memory cells of one string of memory cells containing a memory cell selected for reading are activated and only one of two memory cells of an other string of memory cells is activated in response to first and second control signals. At 376, the selected memory cell is activated and a memory cell of the other string of memory cells is activated in response to a third control signal. At 378, each remaining memory cell of the one string of memory cells is activated. For certain embodiments, each remaining memory cell of the other string of memory cells is also activated. At 380, the one data line is discharged through the one string of memory cells if the selected memory cell is activated in response to the third control signal.

Conclusion

Methods and devices are described for memory reads involving precharging adjacent data lines to a particular voltage for a read operation. During the operation, a data line associated with a selected memory cell is selectively discharged from the particular voltage depending upon the data value of the selected memory cell while the adjacent data line is maintained at the particular voltage. Various embodiments include the array architecture to facilitate precharging the adjacent pair of data lines to a particular voltage and maintaining the unselected data line at the particular voltage during a sensing phase of a read operation.

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory device, comprising:
    an adjacent pair of strings of memory cells, each comprising a memory cell to store user data and two or more dummy memory cells; and
    an adjacent pair of data lines that are electrically isolated from each other, wherein one data line of the adjacent pair of data lines is selectively coupled to one string of memory cells of the adjacent pair of strings of memory cells and the other data line of the adjacent pair of data lines is selectively coupled to the other string of memory cells of the adjacent pair of strings of memory cells;
    wherein a first dummy memory cell of the one string of memory cells of the adjacent pair of strings of memory cells has a control gate commonly coupled to a control gate of a first dummy memory cell of the other string of memory cells of the adjacent pair of strings of memory cells;
    wherein a second dummy memory cell of the one string of memory cells has a control gate commonly coupled to a control gate of a second dummy memory cell of the other string of memory cells;
    wherein the first dummy memory cell of the one string of memory cells has a threshold voltage greater than a threshold voltage of the first dummy memory cell of the other string of memory cells; and
    wherein the second dummy memory cell of the one string of memory cells has a threshold voltage less than a threshold voltage of the second dummy memory cell of the other string of memory cells.

2. The memory device of claim 1, wherein the adjacent pair of strings of memory cells each comprise a plurality of memory cells to store user data.

3. The memory device of claim 1, wherein the two or more dummy memory cells of the one string of memory cells and the two or more dummy memory cells of the other string of memory cells are each located at the same end of their respective strings of memory cells.

4. The memory device of claim 3, wherein the two or more dummy memory cells of the one string of memory cells are each located at the end of the one string of memory cells nearest the one data line that is selectively coupled to the one string of memory cells and the two or more dummy memory cells of the other string of memory cells are each located at the end of the other string of memory cells nearest the other data line that is selectively coupled to the other string of memory cells.

5. The memory device of claim 1, wherein the memory cell to store user data is coupled between one dummy memory cell of the two or more dummy memory cells and another dummy memory cell of the two or more dummy memory cells for each string of memory cells of the adjacent pair of strings of memory cells.

6. The memory device of claim 1, for at least one string of memory cells of the adjacent pair of strings of memory cells, further comprising a select gate coupled between the at least one string of memory cells and a node selected from the group consisting of a supply node and the data line selectively coupled to the at least one string of memory cells.

7. The memory device of claim 6, further comprising more than one select gate coupled between the at least one string of memory cells and the node.

8. The memory device of claim 1, wherein the dummy memory cells have the same structure as the memory cell to store user data.

9. The memory device of claim 8, wherein the memory cell to store user data is a non-volatile memory cell capable of defining data values through changes in threshold voltage.

10. The memory device of claim 9, wherein the structure of the memory cell is selected from the group consisting of a floating-gate memory cell, a phase-change memory cell, a ferroelectric memory cell, and a charge trap memory cell.

11. A memory device, comprising:
    an adjacent pair of strings of memory cells, each comprising a memory cell to store user data and two or more dummy memory cells;
    wherein a first dummy memory cell of one string of memory cells of the adjacent pair of strings of memory cells has a control gate commonly coupled to a control gate of a first dummy memory cell of the other string of memory cells of the adjacent pair of strings of memory cells;
    wherein a second dummy memory cell of the one string of memory cells has a control gate commonly coupled to a control gate of a second dummy memory cell of the other string of memory cells;
    wherein the first dummy memory cell of the one string of memory cells has a threshold voltage greater than a threshold voltage of the first dummy memory cell of the other string of memory cells; and
    wherein the second dummy memory cell of the one string of memory cells has a threshold voltage less than a threshold voltage of the second dummy memory cell of the other string of memory cells; and further comprising:
    an adjacent pair of data lines, wherein one data line of the adjacent pair of data lines is associated with the one string of memory cells and the other data line of the adjacent pair of data lines is associated with the other string of memory cells;
    a first supply node, wherein the one string of memory cells is between the one data line and the first supply node and the other string of memory cells is between the other data line and the first supply node; and
    a second supply node, wherein the one data line is selectively coupled to the second supply node and the other data line is selectively coupled to the second supply node;
    wherein the memory device is configured to isolate the one data line from its associated second supply node during a sensing phase of a read operation of a selected memory cell of the one string of memory cells; and
    wherein the memory device is configured to couple the other data line to its associated second supply node during the sensing phase of the read operation.

12. The memory device of claim 11, wherein the memory device is further configured to isolate the first supply node from the second supply node associated with the other data line during the sensing phase of the read operation.

13. The memory device of claim 11, wherein the second supply node comprises a plurality of second supply nodes, and wherein the one data line is selectively coupled to a different second supply node than the other data line.

14. A memory device, comprising:
an adjacent pair of data lines that are electrically isolated from each other;
an adjacent pair of strings of memory cells, each comprising a memory cell to store user data and two or more dummy memory cells;
wherein one string of memory cells of the adjacent pair of strings of memory cells selectively provides a path from one data line of the adjacent pair of data lines to a supply node;
wherein the other string of memory cells of the adjacent pair of strings of memory cells selectively provides a path from the other data line of the adjacent pair of data lines to the supply node;
wherein a first dummy memory cell of the one string of memory cells has a control gate commonly coupled to a control gate of a first dummy memory cell of the other string of memory cells;
wherein a second dummy memory cell of the one string of memory cells has a control gate commonly coupled to a control gate of a second dummy memory cell of the other string of memory cells;
wherein a first dummy memory cell of the one string of memory cells has a threshold voltage greater than a threshold voltage of the first dummy memory cell of the other string of memory cells; and
wherein a second dummy memory cell of the one string of memory cells has a threshold voltage less than a threshold voltage of the second dummy memory cell of the other string of memory cells.

15. The memory device of claim 14, wherein a target threshold voltage of the first dummy memory cell of the one string of memory cells is equal to a target threshold voltage of the second dummy memory cell of the other string of memory cells and wherein a target threshold voltage of the second dummy memory cell of the one string of memory cells is equal to a target threshold voltage of the first dummy memory cell of the other string of memory cells.

16. The memory device of claim 14, wherein each data line of the adjacent pair of data lines has an additional path to the array source selectively provided by an additional string of memory cells.

17. The memory device of claim 14, further comprising:
a third string of memory cells and a fourth string of memory cells, each comprising a memory cell to store user data and two or more dummy memory cells;
wherein a first dummy memory cell of the third string of memory cells has a control gate commonly coupled to a control gate of a first dummy memory cell of the fourth string of memory cells and to the control gate of the first dummy memory cell of the one string of memory cells;
wherein a second dummy memory cell of the third string of memory cells has a control gate commonly coupled to a control gate of a second dummy memory cell of the fourth string of memory cells and to the control gate of the second dummy memory cell of the one string of memory cells;
wherein the first dummy memory cell of the third string of memory cells has a threshold voltage greater than a threshold voltage of the first dummy memory cell of the fourth string of memory cells and greater than the threshold voltage of the first dummy memory cell of the other string of memory cells; and
wherein the second dummy memory cell of the third string of memory cells has a threshold voltage less than a threshold voltage of the dummy memory cell of the fourth string of memory cells and less than the threshold voltage of the second dummy memory cell of the other string of memory cells.

18. The memory device of claim 17, wherein the threshold voltages of the first dummy memory cells are such that a single control signal is capable of activating the first dummy memory cell of the other string of memory cells and the first dummy memory cell of the fourth string of memory cells while deactivating the first dummy memory cell of the one string of memory cells and the first dummy memory cell of the third string of memory cells.

19. The memory device of claim 17, wherein the threshold voltages of the second dummy memory cells are such that a single control signal is capable of activating the second dummy memory cell of the one string of memory cells and the second dummy memory cell of the third string of memory cells while deactivating the second dummy memory cell of the other string of memory cells and the second dummy memory cell of the fourth string of memory cells.

20. The memory device of claim 17, wherein target threshold voltages of the first dummy memory cells repeat in a first alternating pattern and wherein target threshold voltages of the second dummy memory cells repeat in a second alternating pattern.

21. The memory device of claim 20, wherein the first alternating pattern is different than the second alternating pattern.

22. The memory device of claim 21, wherein the first alternating pattern is opposite the second alternating pattern.

23. A memory device, comprising:
an adjacent pair of data lines;
an adjacent pair of strings of memory cells, each comprising a memory cell to store user data and two or more dummy memory cells;
wherein one string of memory cells of the adjacent pair of strings of memory cells selectively provides a path from one data line of the adjacent pair of data lines to a supply node;
wherein the other string of memory cells of the adjacent pair of strings of memory cells selectively provides a path from the other data line of the adjacent pair of data lines to the supply node;
wherein a first dummy memory cell of the one string of memory cells has a control gate commonly coupled to a control gate of a first dummy memory cell of the other string of memory cells;
wherein a second dummy memory cell of the one string of memory cells has a control gate commonly coupled to a control gate of a second dummy memory cell of the other string of memory cells;
wherein the first dummy memory cell of the one string of memory cells has a threshold voltage greater than a threshold voltage of the first dummy memory cell of the other string of memory cells;
wherein the second dummy memory cell of the one string of memory cells has a threshold voltage less than a threshold voltage of the second dummy memory cell of the other string of memory cells; and
wherein the memory device is configured to precharge both data lines of the adjacent pair of data lines to a particular voltage for a read operation of a selected memory cell on a particular data line of the adjacent pair of data lines, and to maintain the data line of the adjacent pair of data lines other than the particular data line at the particular voltage during a sensing phase of the read operation.

* * * * *

UNITED STATES PATENT AND TRADEMARK OFFICE
CERTIFICATE OF CORRECTION

PATENT NO. : 8,547,750 B2  
APPLICATION NO. : 13/081920  
DATED : October 1, 2013  
INVENTOR(S) : Aaron Yip Page 1 of 1

It is certified that error appears in the above-identified patent and that said Letters Patent is hereby corrected as shown below:

In the Claims

In column 15, line 29, in Claim 14, delete "a" and insert -- the --, therefor.

In column 15, line 33, in Claim 14, delete "a" and insert -- the --, therefor.

Signed and Sealed this  
Twenty-eighth Day of January, 2014

Michelle K. Lee  
*Deputy Director of the United States Patent and Trademark Office*